United States Patent
Lui et al.

(10) Patent No.: US 7,671,662 B2
(45) Date of Patent: Mar. 2, 2010

(54) THERMALLY STABLE SEMICONDUCTOR POWER DEVICE

(75) Inventors: Sik K Lui, Sunnyvale, CA (US); Anup Bhalla, Santa Clara, CA (US); Sanjay Havanur, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/290,270

(22) Filed: Oct. 28, 2008

(65) Prior Publication Data

US 2009/0128223 A1    May 21, 2009

Related U.S. Application Data

(63) Continuation of application No. 11/480,041, filed on Jun. 30, 2006, now Pat. No. 7,443,225.

(51) Int. Cl.
*H01L 35/00* (2006.01)
(52) U.S. Cl. ..................................... 327/513
(58) Field of Classification Search ................. 327/310, 327/325, 512, 513, 583, 584
See application file for complete search history.

(56) References Cited

U.S. PATENT DOCUMENTS

| | | | | |
|---|---|---|---|---|
| 5,635,823 | A * | 6/1997 | Murakami et al. | 323/277 |
| 6,091,279 | A * | 7/2000 | Hamparian | 327/513 |
| 6,278,313 | B1 * | 8/2001 | Kakuta et al. | 327/317 |
| 6,288,597 | B1 * | 9/2001 | Hasegawa et al. | 327/513 |
| 6,603,343 | B2 * | 8/2003 | Yamaguchi et al. | 327/513 |
| 6,788,128 | B2 * | 9/2004 | Tsuchida | 327/427 |
| 6,888,711 | B2 * | 5/2005 | Kohno | 361/91.1 |
| 6,978,122 | B2 * | 12/2005 | Kawakyu et al. | 455/80 |

* cited by examiner

*Primary Examiner*—Jeffrey S Zweizig
(74) *Attorney, Agent, or Firm*—Bo-In Lin

(57) ABSTRACT

A semiconductor power device includes a circuit to provide a gate signal wherein the gate signal has a negative temperature coefficient of gate driving voltage for decreasing a gate driving voltage with an increase temperature whereby the semiconductor power device has a net Ids temperature coefficient that is less than or equal to zero. In an exemplary embodiment, the gate voltage driver includes a diode that has a negative forward voltage temperature coefficient connected between a gate and a source of the semiconductor power device. In another embodiment, the gate voltage is integrated with the semiconductor power device manufactured as part of an integrated circuit with the semiconductor power device.

14 Claims, 9 Drawing Sheets

THERMALLY STABLE SEMICONDUCTOR POWER DEVICE

This Application is a Continuation Application and claims a Priority Filing Date of Jun. 30, 2006 benefited from a previously filed application Ser. No. 11/480,041 issued as U.S. Pat. No. 7,443,225 on Oct. 28, 2008, filed previously by the inventors of this Patent Application.

BACKGROUND OF THE INVENTION

1. Field of the Invention

The invention disclosed herein relates generally to configuration and performance of the semiconductor power devices and circuits. More particularly, this invention relates to circuit design, device configuration and manufacturing method for providing thermally stable semiconductor power devices such as the trenched MOSFET device.

2. Description of the Prior Art

The technical challenges of maintaining thermal stability of the semiconductor power devices become a special concern with the advent of high-speed metal oxide semiconductor (MOS) gate devices. Particularly, when the semiconductor power devices such as a MOSFET device is implemented for power-switching applications, the operation often subject the device to operate under a high current and high voltage condition. These operation conditions lead to great power dissipation and causes temperature to rise rapidly. As will be further discussed below, unless properly controlled, the semiconductor power device can encounter a thermal runaway phenomenon that would eventually lead to device and system failures.

There is an urgent demand to resolve such technical problems because the semiconductor power devices such as the MOSFET transistors are widely implemented in wide varieties of electronic systems and particularly applied for high power and high frequency switching operations. When the MOSFET transistors are used in applications such as the low dropout voltage regulator (LDO), the power MOSFET transistors are operated in the saturated region where both the source to drain voltage, i.e., Vds, and the source to drain current, i.e., Ids, are high simultaneously. Under this operating condition, the power dissipation of the MOSFET will cause the temperature to rise. If designed improperly, thermal runaway will occur and the Power MOSFET transistor will fail due to overheating.

FIG. 1 depicts a typical drain current versus the applied gate-to-source voltage, i.e., Vgs, of a Power MOSFET transistor for a fixed source to drain voltage Vds. As shown in FIG. 1, there is no appreciable drain current, i.e., Ids, until the applied Vgs exceeds the threshold voltage of the transistor. When the operating temperature of the Power MOSFET transistor is increased, the threshold voltage (Vt) of the transistor will decrease due to a negative temperature coefficient (TC). With the increase of temperature, the gate overdrive voltage, as defined by (Vgs−Vt) where Vt is the threshold voltage, will also increase. This higher gate overdrive voltage will further increase the drain current of the transistor thus causes a further increase in the operating temperature. In the meantime, in response to a higher operating temperature, the drain current of the transistor tends to decrease because of the decrease of the mobility of the carrier with rising temperature. Therefore, there are two competing effects caused by an increase in the operating temperature. On the one hand, the higher temperature leads to lower threshold voltage that causes a higher current while on the other hand, the higher temperature causes a decrease in carrier mobility that leads to a lower current. Unfortunate these two competing and conflict effects do not exactly cancel each other. FIG. 2 illustrates the shift of the threshold voltage Vt by superimposing the Ids versus Vgs curves at approximately room temperature of 25 degrees Celsius and 125 degrees Celsius. On the left side of these two curves is a region of negative temperature coefficient and on the right is a region of positive temperature coefficient.

Referring to FIG. 2 again, the reduction in threshold is indicated by the shift of the knee of the Ids curve to the left. The reduction in carrier mobility reduces the slope of the Ids curve. The crossover point of the two curves is commonly defined as the Ids0. The temperature coefficient (TC) of the drain current is negative if the operating current of the MOSFET is larger than Ids0. The temperature coefficient will be positive if the operating current of the MOSFET is lower than Ids0. A thermal runaway occurs when the operating current and voltage of the MOSFET transistor cause the temperature to rise and the higher temperature causes the current to increase and further increase the temperature of the transistor. This problem is even more serious for trench Power MOSFET transistor due to its higher trans-conductance.

There have been numerous approaches proposed to address this problem. A low trans-conductance planar MOSFET is recommended by C. Blake, et al., in "Evaluating the Reliability of Power MOSFETs," Power Electronics Technology, November, pp. 40-44, 2005. Alternately, different techniques are presented by providing a ballasting the source of the transistor that also helps to reduce the effects of the problem. Both of these two approaches increase the ON resistance of the MOSFET transistor. As a consequence, a lager or more costly transistor is required for implementing such solution to overcome the thermal problems of thermal instability.

Therefore, a need still exists in the art to provide an improved device design and test configurations and methods to overcome the above discussed limitations and difficulties.

SUMMARY OF THE PRESENT INVENTION

It is therefore an aspect of the present invention to provide an improved semiconductor power device that includes circuit that provides a negative temperature coefficient gate drive signal. The negative temperature coefficient of the gate voltage signal can then compensate the negative temperature coefficient of the threshold voltage of the semiconductor power device thus providing a net negative temperature coefficient Ids to achieve a thermally stabilized MOSFET power device.

It is another aspect of the present invention that a circuit that provides a negative temperature coefficient gate drive signal is implemented with simple circuits such as diodes and resistors. The simple circuits implemented as gate voltage driver can be conveniently integrated with the semiconductor power device and can be manufactured as part of the integrated circuits. The processes for implementing the gate voltage driver can be simplified with minimal increase to the manufacturing cost and without significantly increasing the size and not changing the form factor of the packaged device.

Specifically, it is an object of the present invention to provide an improved power semiconductor power device with thermal stability by connecting a circuit that provides a negative temperature coefficient gate drive signal coupled in parallel between the source and the gate of a MOSFET device. The circuit can be implemented with two interconnected diodes that have negative forward voltage temperature coefficient. By connecting these diodes with resistors between the source and gate, the decrease of the gate driving voltage with an increase of temperature thus compensate the decrease of the threshold voltage. A thermally stabilized MOSFET device is achieved because negative temperature coefficient Ids is provided to the semiconductor power device with the added circuit of this invention.

It is another aspect of this invention that a ESD protection circuit may be implemented that can provide dual functions of ESD protection and also negative temperature coefficient of the gate driving voltage.

Briefly in a preferred embodiment this invention discloses a semiconductor power device that includes a circuit that provides a gate signal wherein the gate signal has a negative temperature coefficient of gate driving voltage for decreasing a gate driving voltage with an increase temperature whereby the semiconductor power device has a net Ids temperature coefficient that is less than or equal to zero. In an exemplary embodiment, the gate voltage driver includes a diode that has a negative forward voltage temperature coefficient connected between a gate and a source of the semiconductor power device. In another embodiment, the gate voltage is integrated with the semiconductor power device manufactured as part of an integrated circuit with the semiconductor power device.

The present invention further discloses a method for compensating a negative coefficient of a threshold of a semiconductor power device by connecting a circuit that provides a negative temperature coefficient gate drive signal to a gate whereby a net source-drain current (Ids) temperature coefficient of less than or equal to zero is achieved with the decrease of a gate driving voltage decreased equal to or more than a decrease in the threshold voltage with an increase in temperature.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

The negative temperature coefficient (TC) of the threshold voltage of the power MOSFET transistor is the cause of the thermal instability of the Power MOSFET transistor. As discussed above, the negative temperature coefficient (TC) of the threshold voltage leads to a positive temperature coefficient of the gate overdrive voltage (Vgs−Vt) because the threshold voltage Vt decreases with an increase of temperature. Unlike the conventional techniques, this invention takes a different and novel approach to overcome this challenge of thermal instability by not dealing directly with the negative TC of the threshold voltage. Instead of reducing or eliminating the negative TC of the threshold voltage, this invention deal directly with the temperature coefficient (TC) of the gate overdrive voltage (Vgs−Vt). Thermal stability of a MOSFET device is achieved by a new circuit configuration of this invention to compensate the negative threshold TC of the threshold voltage to maintain a negative or zero temperature coefficient for the gate overdrive voltage (Vgs−Vt). Once the gate overdrive voltage (Vgs−Vt) has a zero TC or negative TC, the Power MOSFET transistor will be thermally stable at any operating current.

Figure 1:
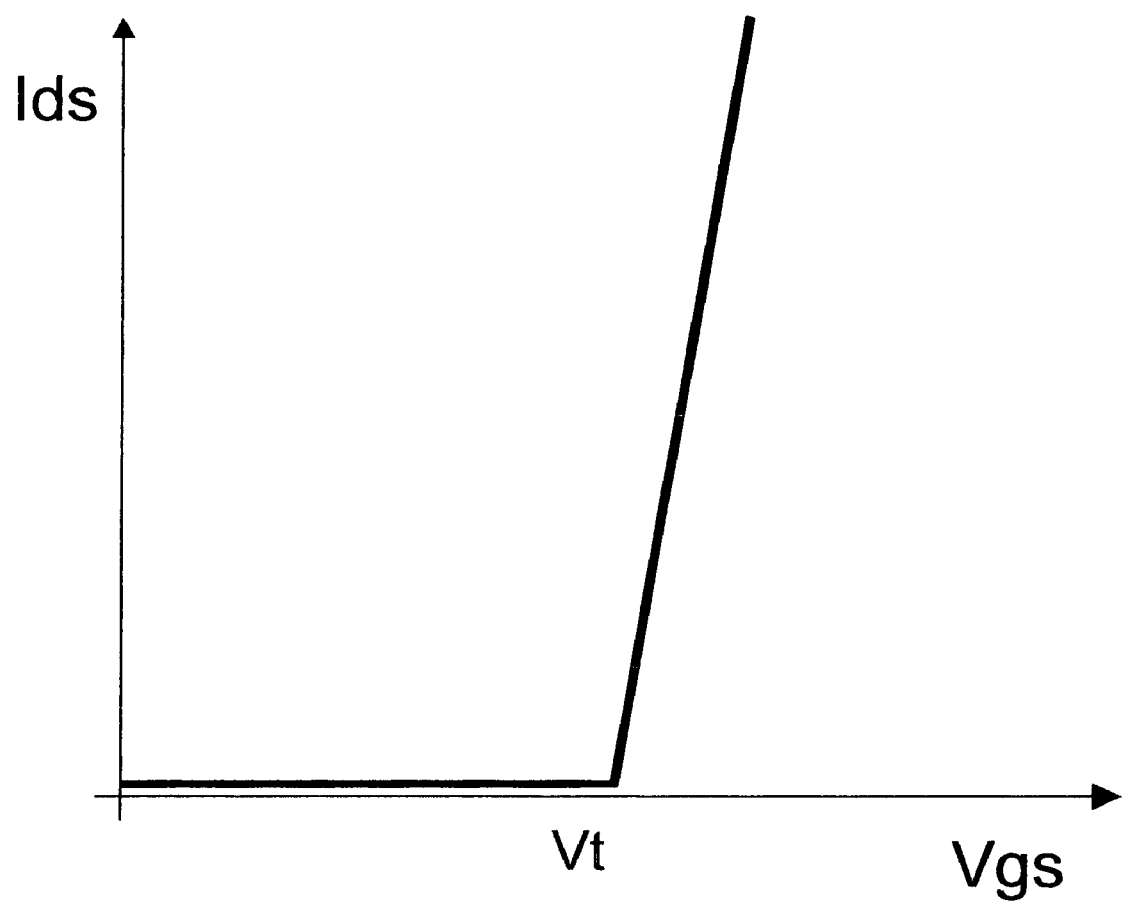
FIG. 1 is a diagram for illustrating the functional relationship of a drain current versus applied voltage Vgs of a power MOSFET.
Figure 2:
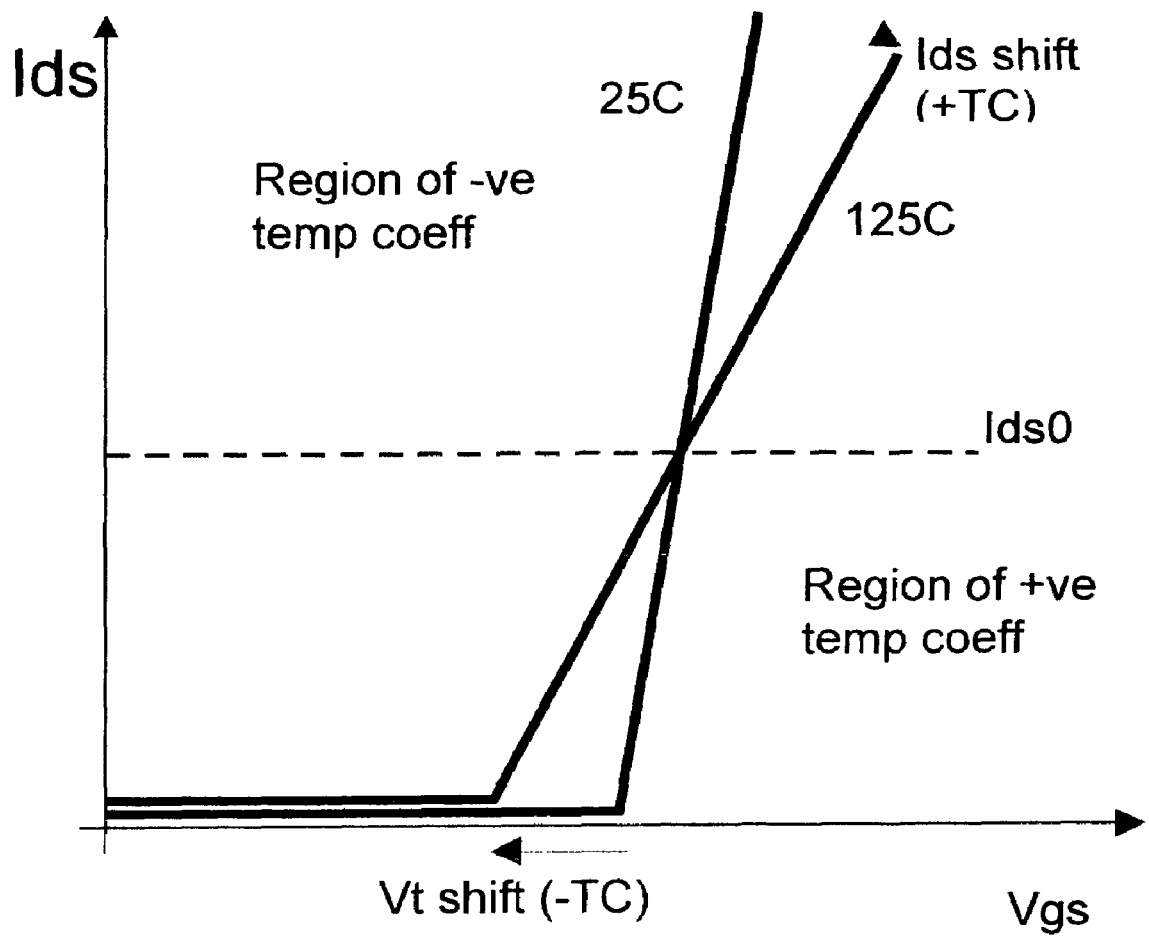
FIG. 2 is a diagram for showing a high temperature drain current Ids versus applied voltage Vgs of a power MOSFET device superimposed on the room temperature Ids versus the applied voltage Vgs.
Figure 3:
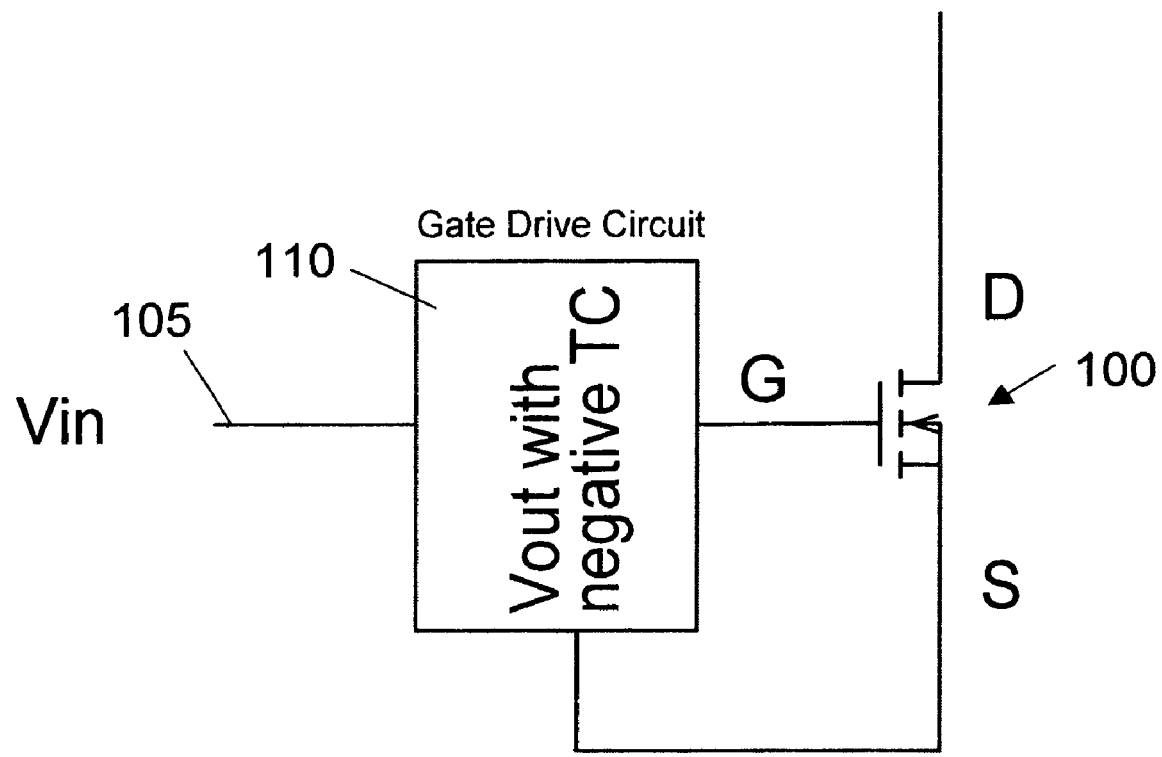
FIG. 3 shows a functional block diagram for implementing a gate overdrive voltage to provide a zero or negative temperature coefficient to achieve a thermally stable power MOSFET.

Therefore, as shown in FIG. 3, a gate drive circuit 110 is connected to an N channel MOSFET device 100 with the gate drive circuit 110 to introduce a negative TC in the gate drive of the MOSFET to compensate for the negative TC of the threshold voltage. The gate drive circuit 110 is a simple circuit that can be co-packaged or integrated with the MOSFET device 100. The gate drive signal generated from the gate drive circuit 110 is applied to compensate the negative TC of the threshold voltage of the MOSFET 100. In essence, this invention discloses a semiconductor power device having a negative threshold-voltage temperature coefficient. The semiconductor is further integrated with circuit that provides negative temperature coefficient of a gate drive voltage to compensate the negative temperature coefficient threshold-voltage whereby the semiconductor power device has a net source-drain current (Ids) temperature coefficient less than or equal to zero such that the semiconductor power device is thermally stabilized.

Figure 4:
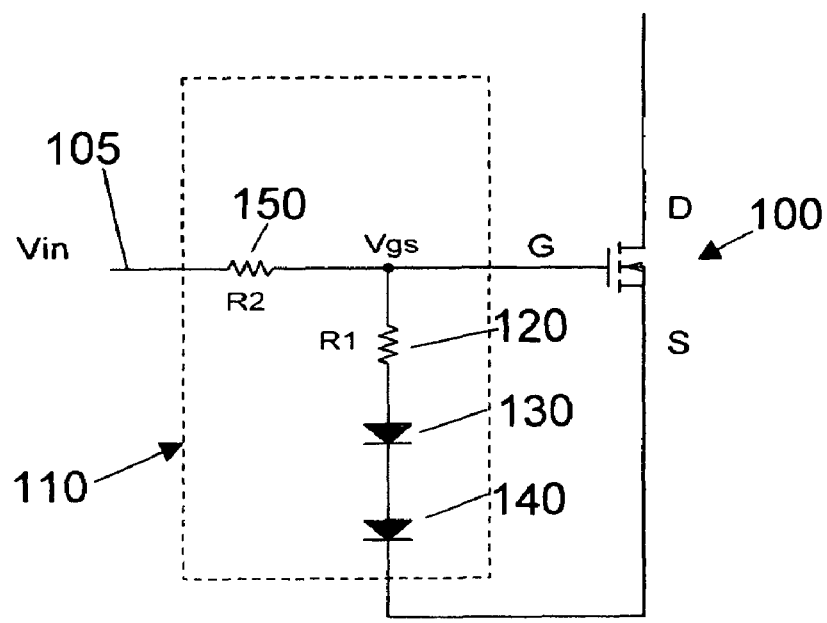
FIG. 4 shows a circuit diagram for implementing the gate overdrive voltage of FIG. 3 to provide a zero or negative temperature coefficient to achieve a thermally stable power MOSFET.

FIG. 4 is a circuit diagram to show the actual implementation of the gate drive circuit 110 with a negative temperature coefficient. The gate drive circuit 110 connected between the input voltage 105 and the MOSFET device 100 includes a circuit branch that includes a first resistor 120 with a resistance R1 connected in series with a first diode 130 and a second diode 140 wherein the circuit branch is connected in parallel between the source and gate terminals of the MOSFET device 100. The input voltage 105 is further connected to the gate and the circuit branch through a second resistor 150 with a resistance R2. With a gate voltage driver 110 as shown in FIG. 4, the gate to source voltage can be expressed as:

$$Vgs = Vin\frac{R1}{R1+R2} + 2Vd\frac{R2}{R1+R2} \quad (1)$$

where Vd is the diode forward voltage.

The gate overdrive voltage can be represented as $$Vgs - Vt = Vin\frac{R1}{R1+R2} + 2Vd\frac{R2}{R1+R2} - Vt \qquad (2)$$

The temperature coefficient of the gate overdrive voltage becomes $$\frac{d(Vgs-Vt)}{dT} = 2\left[\frac{R2}{R1+R2}\right]\left(\frac{dVd}{dT}\right) - \frac{dVt}{dT} \qquad (3)$$

It is well known the temperature coefficient (TC) of the forward voltage (Vd) is about −2 mV/° C. With the proper choice of R1, R2 and the number of diodes, the TC of the gate overdrive can be adjusted to be zero or even negative. The reduction of the gate overdrive voltage due to the resistors also enables the use of thinner gate oxide for the MOSFET transistor. The circuit implementation of the gate voltage driver as shown in FIG. 4 can be easily integrated in the semiconductor power device as part of the integrated circuit (IC) as will be further discussed in FIG. 6 below.

Figure 5:
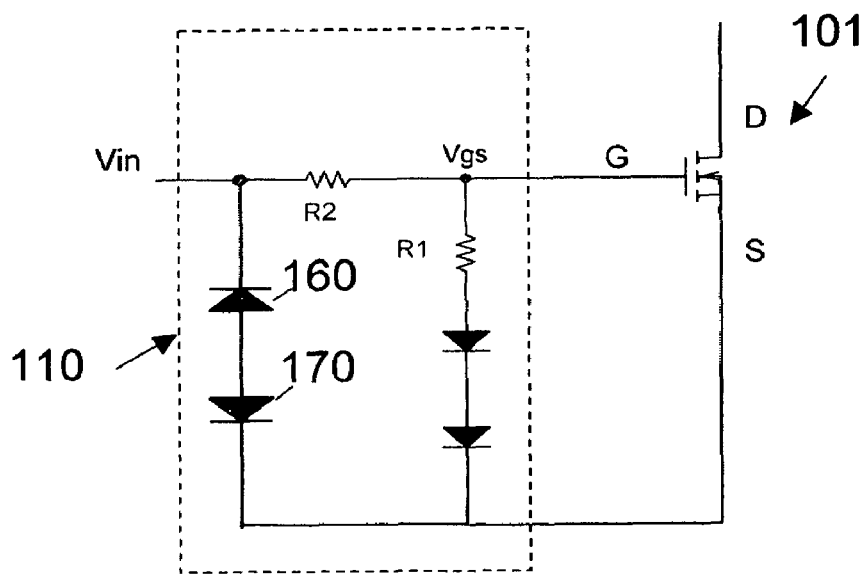
FIG. 5 shows a electrostatic protection device (ESD) configured also as a gate voltage driver voltage to provide a zero or negative temperature coefficient to achieve a thermally stable power MOSFET device.

The gate drive circuit 110 in FIG. 3 may be further implemented as in FIG. 5. In addition to the diodes 130 and 140 as well as the resistors 120 and 150 shown in FIG. 4, the gate drive circuit 110 as shown in FIG. 5 further comprises diodes 160 and 170 to provide ESD protection. By arranging the connections, a circuit as shown in FIG. 5 can be implemented to further provide ESD protection. Therefore, an ESD protected thermally stable MOSFET can be achieved.

Figure 6A:
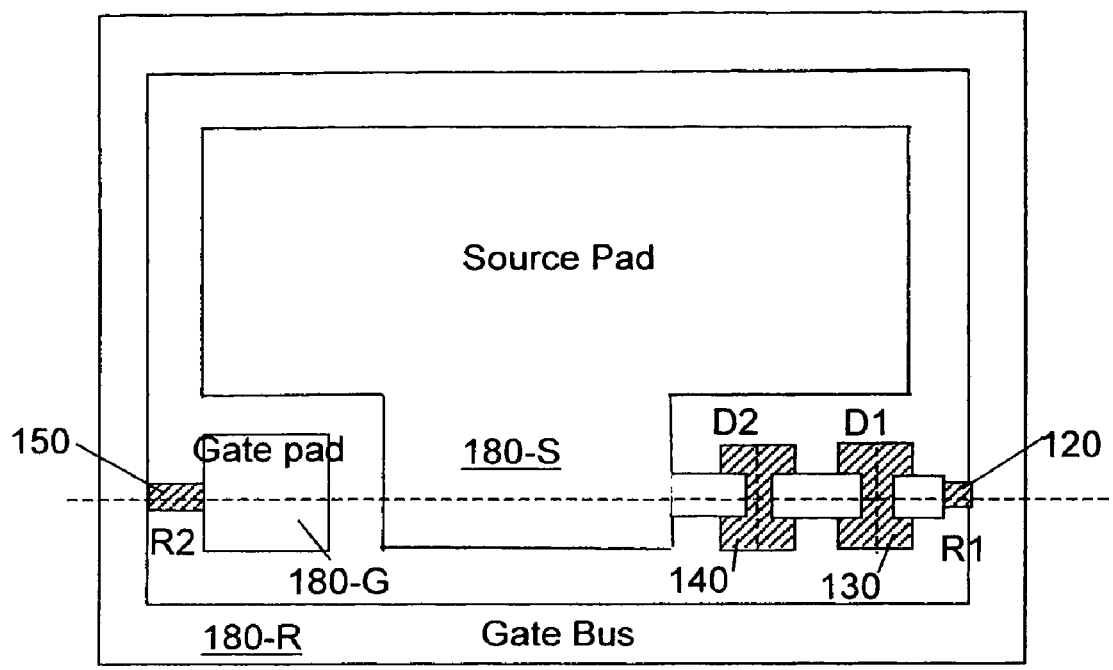
FIGS. 6A-6C show the top view and cross sectional view for implementing the circuit as shown in FIG. 4 as a thermally stable planar MOSFET device and a thermally stable trench MOSFET device
Figure 6B:
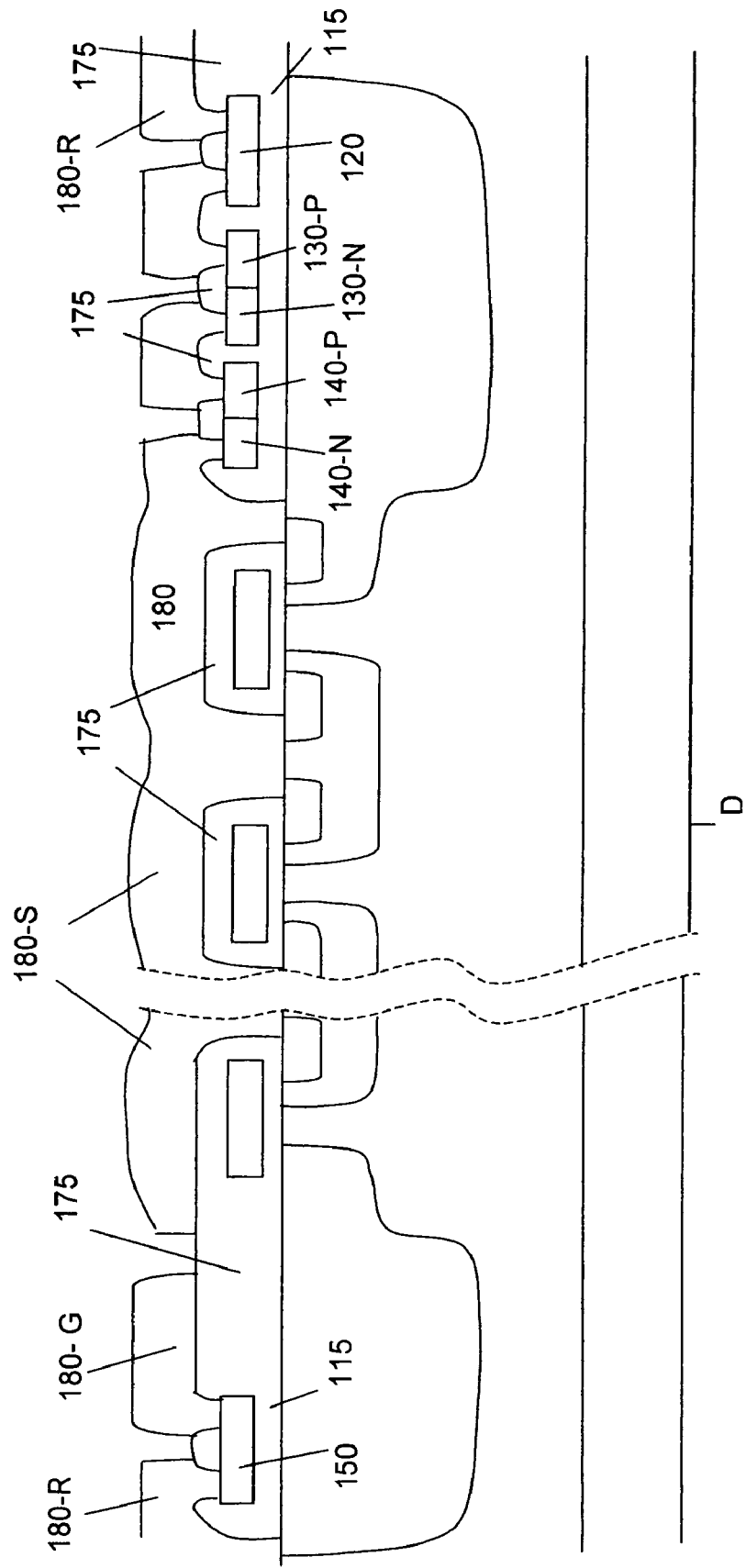
Figure 6C:
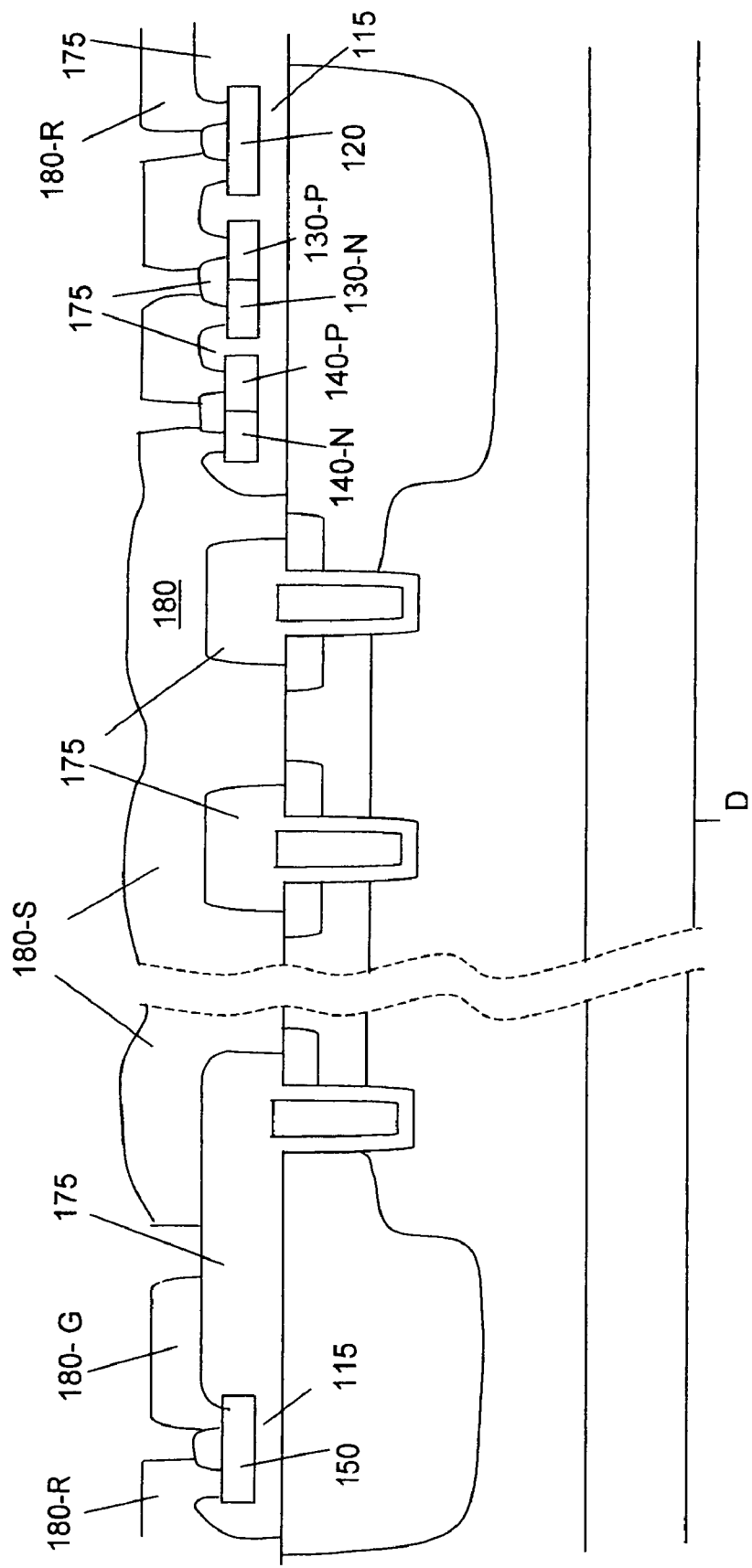

Referring to FIGS. 6A-6C for a semiconductor power device such as a MOSFET device integrated with a gate voltage driver circuit of FIG. 4. The MOSFET device may be a planar device as shown in cross sectional view FIG. 6B, or a trench MOSFET device as shown in cross sectional view FIG. 6C. As shown in the top view FIG. 6A, integrated to this semiconductor power device is also the gate voltage driver circuit with the first and second diodes 130 and 140 and also the first and second resistor 120 and 150 formed on a polysilicon layer where the gate voltage driver circuit 110 as shown in FIG. 4 is coupled in parallel between the gate and source terminals. The polysilicon layer forming the gate voltage driver circuit 110 may be deposited on top of a field oxide layer 115 at the same time the MOSFET gate is form or on a later stage after the gate is formed. The layer is then patterned and doped with desired dopants to form the regions 120, 150, 130-P, 130-N, 140-P and 140-N. An insulation layer 175 is then deposited. Contact holes through insulation layer 175 may be open at the same time the source contact is etched. Contact holes may be open at the same time the source contact is etched. Finally a top surface metal 180 is deposited then patterned to form the connections between diodes and resistors, as well as source pad 180-S and gate pad 180-G. The gate pad 180-G is connected to resistor 150, which is in turn connected to gate bus (runner) 180-R.

Figure 7A:
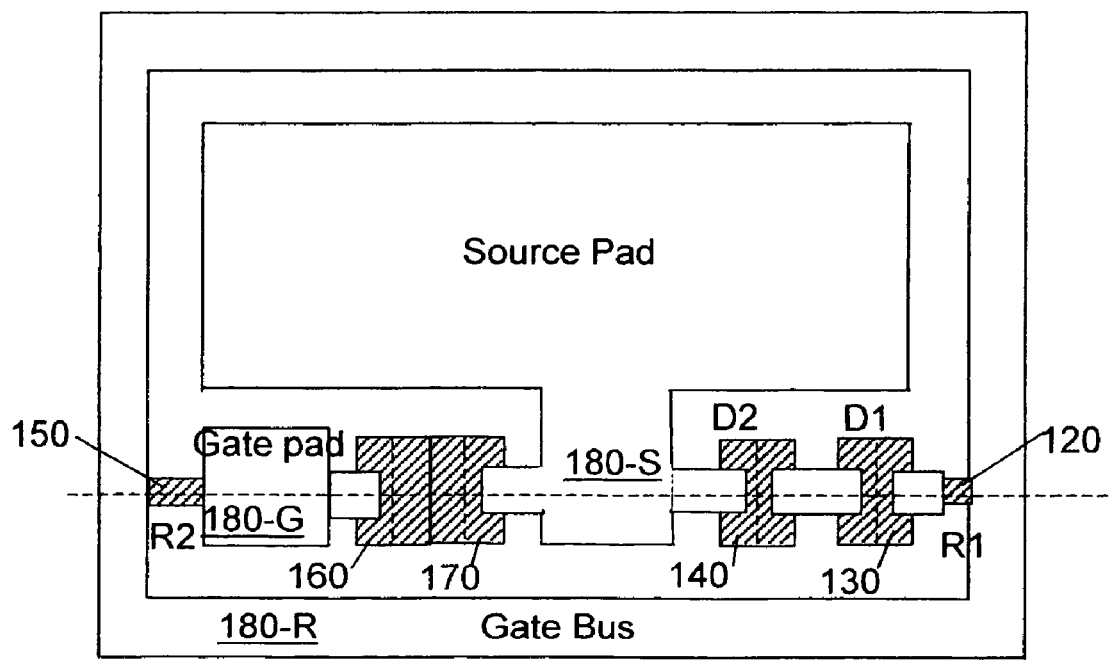
FIGS. 7A-7C show the top view and cross sectional view for implementing the circuit as shown in FIG. 5 as a thermally stable planar MOSFET device and a thermally stable trench MOSFET device
Figure 7B:
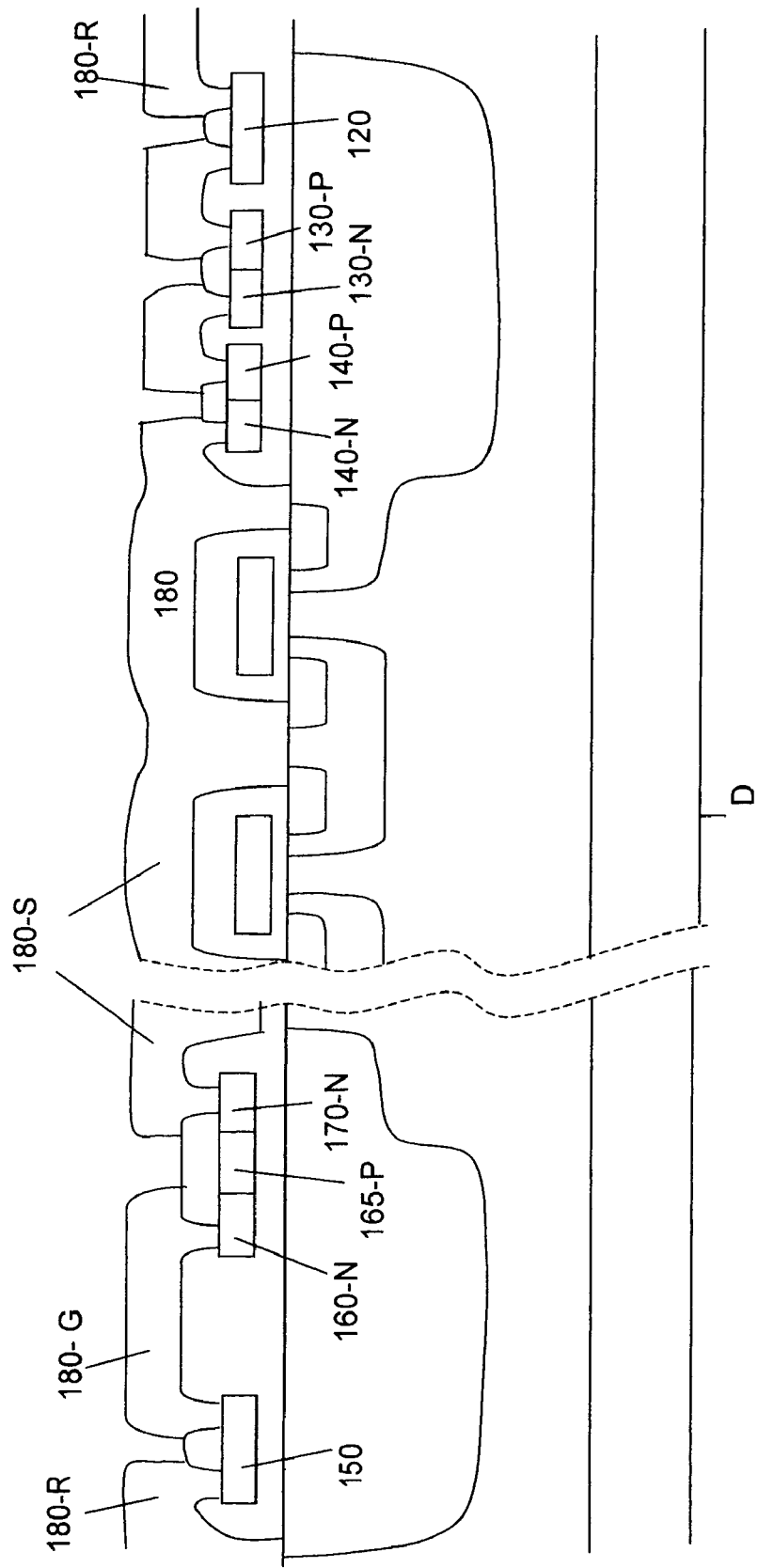
Figure 7C:
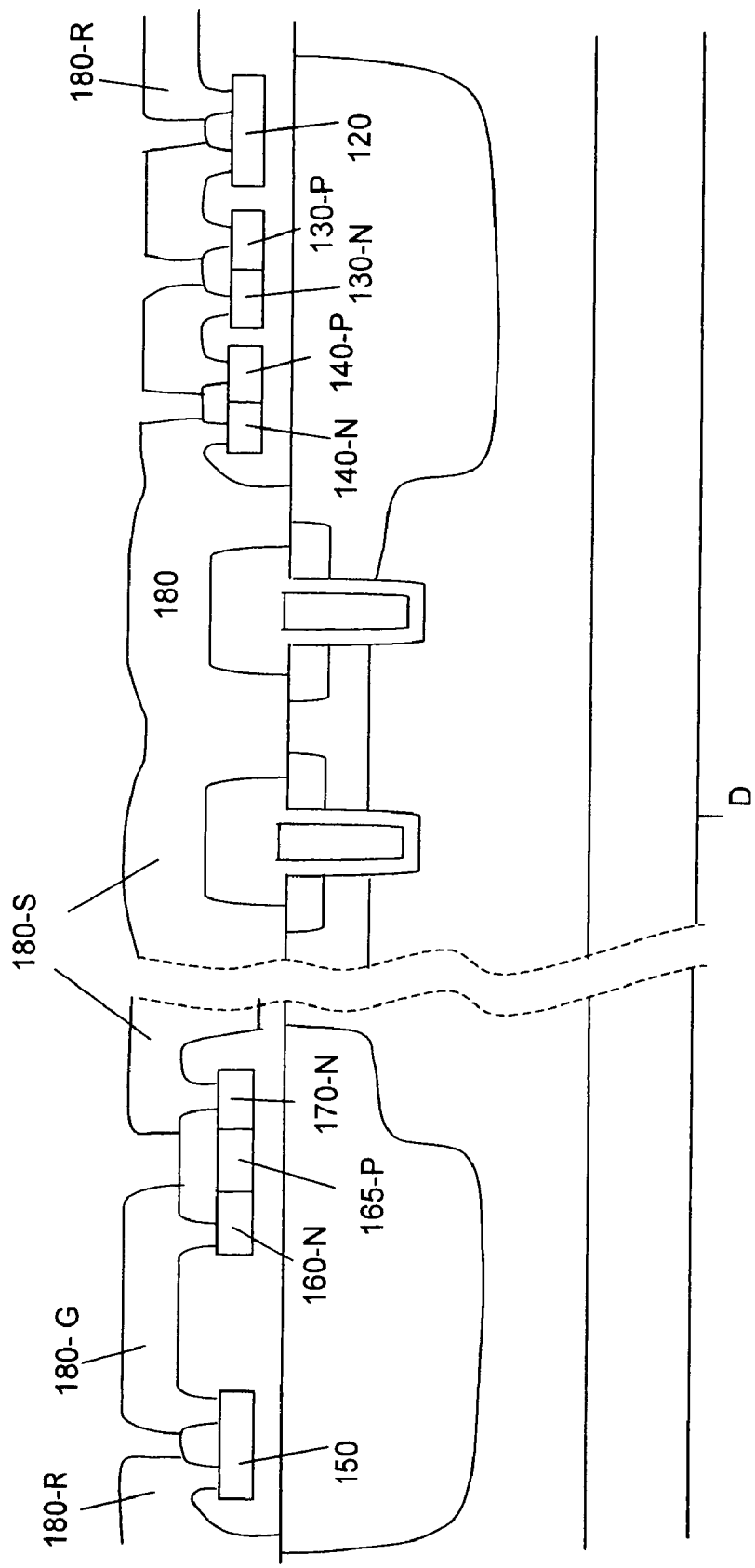

Referring to FIGS. 7A-7C for a semiconductor power device such as a MOSFET device integrated with a gate voltage driver circuit of FIG. 5. The MOSFET device may be a planar device as shown in cross sectional view FIG. 7B, or a trench MOSFET device as shown in cross sectional view FIG. 7C. As shown in the top view FIG. 7A, integrated to this semiconductor power device is also the gate voltage driver circuit with the first and second diodes 130 and 140 and also the first and second resistor 120 and 150, as well as the third and fourth diodes 160 and 170, formed on a polysilicon layer where the gate voltage driver circuit 110 as shown in FIG. 5 is coupled in parallel between the gate and source terminals. The polysilicon layer forming the gate voltage driver circuit 110 may be deposited on top of a filed oxide layer 115 at the same time the MOSFET gate is form or on a later stage after the gate is form. The layer is then patterned and doped with desired dopants to form the regions 120, 150, 130-P, 130-N, 140-P, 140-N, 160-N, 165-P and 170-N. An insulation layer 175 is then deposited. Contact holes through insulation layer 175 may be open at the same time the source contact is etched. Finally a top surface metal 180 is deposited then patterned to form the connections between diodes and resistors, as well as source pad 180-S and gate pad 180-G. The gate pad 180-G is connected to resistor 150, which is in turn connected to gate bus (runner) 180-R.

According to above descriptions, this invention discloses a circuit and a semiconductor power device that includes a circuit for providing a gate driving voltage to a gate of the semiconductor power device wherein the gate driving voltage having a negative temperature coefficient for providing a decreasing gate driving voltage with an increasing temperature whereby the semiconductor power device has a net temperature coefficient less than or equal to zero. In an embodiment of this invention, the circuit for providing a gate driving voltage includes a diode with a negative forward voltage temperature coefficient connected between a gate and a source of the semiconductor power device. In another embodiment, the circuit for providing a gate driving voltage is integrated with the semiconductor power device by manufacturing as a part of an integrated circuit with the semiconductor power device. In another embodiment, the semiconductor power device further includes a trenched or a planar MOSFET device with the circuit for providing the gate driving voltage is integrated as a polysilicon doped diode connected to a source metal and a gate pad. In another embodiment, the semiconductor power device further includes a trenched or a planar MOSFET device with the circuit for providing the gate driving voltage is integrated as a first and a second diodes and a first and a second resistors connected in parallel to a source metal and a gate pad wherein the first and second diodes and first and second resistors are formed on a polysilicon layer. In another embodiment, the semiconductor power device further includes an ESD circuit includes a set of back-to-back diodes coupled in parallel between the gate and a source electrode of the semiconductor power device for protecting the semiconductor power device. In another embodiment, the first and second diodes are disposed on a polysilicon layer and the polysilicon layer is deposited on top of a field oxide layer.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device comprising:
    a circuit for providing a gate driving voltage to a gate of said semiconductor power device wherein said gate driving voltage has a negative temperature coefficient for providing a decreasing gate driving voltage with an increasing temperature whereby the semiconductor power device has a net temperature coefficient less than or equal to zero a circuit branch that includes a first resistor connected in series with a plurality of diodes wherein said circuit branch is connected in parallel with a source and a gate terminals of said semiconductor power device; and a second resistor connecting between said gate of said semiconductor power device and a gate input voltage.

2. The semiconductor power device of claim 1 wherein:

said circuit branch functioning as said circuit for providing a gate driving voltage includes said plurality of diodes include a diode having a negative forward voltage temperature coefficient connected between said gate and said source of said semiconductor power device.

3. The semiconductor power device of claim 1 wherein:

said circuit branch functioning as said circuit for providing a gate driving voltage is integrated with said semiconductor power device by manufacturing as a part of an integrated circuit with said semiconductor power device.

4. The semiconductor power device of claim 1 wherein:

said semiconductor power device further comprises a trenched MOSFET device with said circuit branch functioning as said circuit for providing said gate driving voltage is integrated as a polysilicon doped diode connected to a source metal and a gate pad.

5. The semiconductor power device of claim 1 wherein:

said semiconductor power device further comprises a trenched MOSFET device.

6. The semiconductor power device of claim 1 further comprising:

an ESD circuit comprises a set of back-to-back diodes coupled in parallel with said gate and a source electrode of said semiconductor power device for protecting said semiconductor power device.

7. A method for fabricating a semiconductor power device comprising:

connecting a circuit for providing a gate driving voltage to a gate of said semiconductor power device with a negative temperature coefficient for providing a decreasing gate driving voltage with an increasing temperature whereby the semiconductor power device has a net temperature coefficient less than or equal to zero;

connecting a circuit branch in parallel with a source and a gate terminals of said semiconductor power device with said circuit branch includes a first resistor connected in series with a plurality of diodes; and connecting a second resistor between said gate of said semiconductor power device and a gate input voltage.

8. The method of claim 7 wherein:

said step of connecting said circuit for providing a gate driving voltage includes a step of connecting said circuit branch with said plurality of diodes with a diode having a negative forward voltage temperature coefficient connected between said gate and said source of said semiconductor power device.

9. The method of claim 7 wherein:

said step of fabricating said semiconductor power device further comprises a step of fabricating a trenched MOSFET device with said circuit for providing said gate driving voltage integrated as a polysilicon doped diode connected to a source metal and a gate pad.

10. The method of claim 7 wherein:

said step of fabricating said semiconductor power device further comprises a step of fabricating a trenched MOSFET device.

11. The method of claim 7 further comprising:

connecting a set of back-to-back diodes coupled in parallel with said gate and a source electrode of said semiconductor power device as an ESD protection circuit for protecting said semiconductor power device.

12. A power MOSFET gate drive circuit connected between a gate input voltage and a gate of a power MOSFET device wherein:

said MOSFET gate drive circuit provides a gate driving voltage to the gate of said power MOSFET device with a negative temperature coefficient for providing a decreasing gate driving voltage with an increasing temperature whereby the power MOSFET device has a net temperature coefficient less than or equal to zero;

a circuit branch that includes a first resistor connected in series with a plurality of diodes wherein said circuit branch is connected in parallel with a source and a gate terminals of said MOSFET device; and a second resistor connecting between said MOSFET gate and a gate input voltage.

13. The power MOSFET gate drive circuit of claim 12 further wherein:

a combination of said plurality of diodes and side resistors provides a gate driving voltage to a gate of said power MOSFET device with a negative temperature coefficient for providing a decreasing gate driving voltage with an increasing temperature whereby the power MOSFET device has a net temperature coefficient less than or equal to zero.

14. The power MOSFET gate drive circuit of claim 12 further comprising:

a circuit branch that includes a pair of back to back diodes connecting between said gate input voltage and the source terminal of said MOSFET device for providing ESD protection.

* * * * *